United States Patent [19]

Kawamoto et al.

[11] Patent Number: 4,529,476
[45] Date of Patent: Jul. 16, 1985

[54] GAS FOR SELECTIVELY ETCHING SILICON NITRIDE AND PROCESS FOR SELECTIVELY ETCHING SILICON NITRIDE WITH THE GAS

[75] Inventors: Yoshifumi Kawamoto, Kanagawa; Hiroshi Kawakami, Hachioji; Tokuo Kure, Kokubunji; Shinichi Tachi; Norikazu Hashimoto, both of Hachioji; Tsuyoshi Takaichi, Fujisawa, all of Japan

[73] Assignees: Showa Denko K.K.; Hitachi, Ltd., both of Tokyo, Japan

[21] Appl. No.: 616,114

[22] Filed: Jun. 1, 1984

[30] Foreign Application Priority Data

Jun. 1, 1983 [JP] Japan ................... 58-95651
Nov. 28, 1983 [JP] Japan ................... 58-222072

[51] Int. Cl.$^3$ ............... B44C 1/22; C03C 15/00; C03C 25/06
[52] U.S. Cl. ................. 156/643; 156/646; 156/653; 156/657; 156/659.1; 204/192 E; 252/79.1
[58] Field of Search ............. 156/643, 646, 653, 657, 156/659.1; 204/164, 192 E; 252/79.1; 427/38, 39

[56] References Cited

U.S. PATENT DOCUMENTS

| 3,940,506 | 2/1976 | Heinecke ................. 156/646 X |
| 4,181,564 | 1/1980 | Fogarty et al. ............ 156/646 X |
| 4,377,438 | 3/1983 | Moriya et al. ............. 156/653 X |

FOREIGN PATENT DOCUMENTS 58-34919  3/1983  Japan ................... 156/643

Primary Examiner—William A. Powell
Attorney, Agent, or Firm—Antonelli, Terry & Wands

[57] ABSTRACT

A dry-etching gas suitable for selective etching of silicon nitride and a process for selectively dry-etching silicon nitride with the dry-etching gas are disclosed. Silicon nitride can be dry-etched with a higher selectivity or at a higher etching rate than silicon dioxide and silicon, and a process for fabricating semi-conductor devices can be simplified and devices with a novel structure can be realized.

13 Claims, 6 Drawing Figures

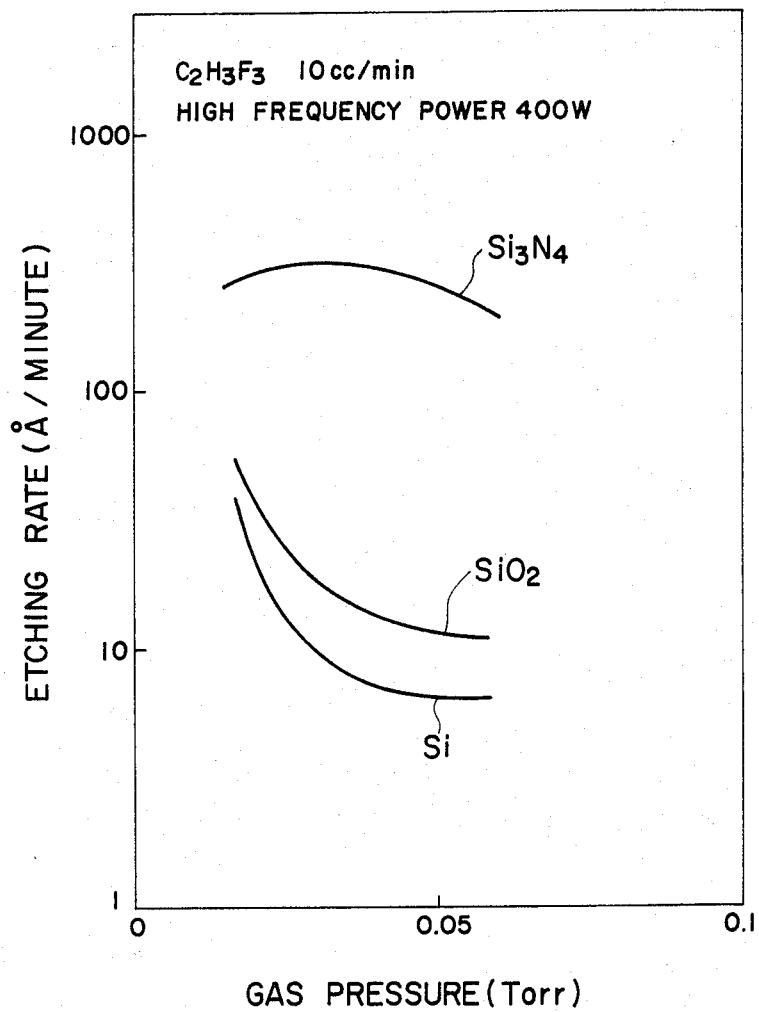

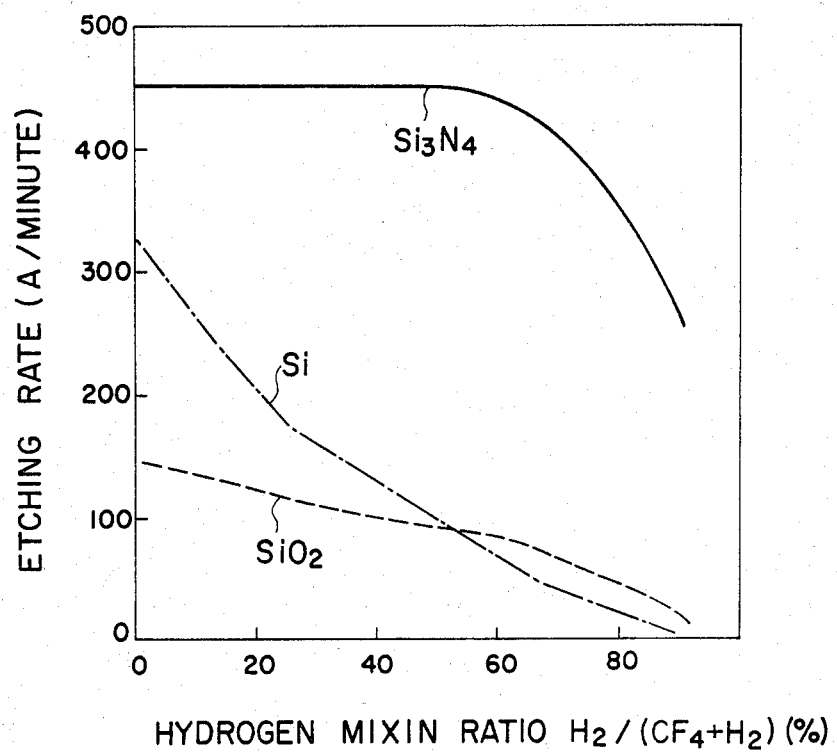

GAS FOR SELECTIVELY ETCHING SILICON NITRIDE AND PROCESS FOR SELECTIVELY ETCHING SILICON NITRIDE WITH THE GAS

BACKGROUND OF THE INVENTION

This invention relates to an etching gas suitable for selectively etching silicon nitride and a process for selectively etching silicon nitride with the etching gas, and more particularly to an etching gas capable of selectively etching silicon nitride with a higher selectivity or at a higher etching rate than silicon oxide and silicon and a process for etching with the etching gas.

As is well known, dry etching of silicon or its compound is carried out with a reacting gas, for example, $CF_4$, $CF_4+O_2$, $NF_3$, $SF_6$, $CHF_3$, $CF_4+H_2$, etc. However, in the conventional dry etching with these reacting gases, etching rates of Si, $SiO_2$ and $Si_3N_4$ with a reacting gas such as $CF_4$, $CF_4+O_2$, $NF_3$ or $SF_6$ are such that the etching rate of Si is highest, and the etching rate is decreased in the order of $Si_3N_4$ and $SiO_2$. With $CHF_3$ or $CF_4+H_2$ as the reacting gas, the etching rates of $SiO_2$ and $Si_3N_4$ are increased, as compared with that of Si, but the etching rate ratio of $Si_3N_4$ to $SiO_2$ is about 2–3, and thus $Si_3N_4$ cannot be selectively etched.

Thus, a reacting gas such as $CF_4+O_2$ or $SF_6$ has been used for selective etching of $Si_3N_4$, but the etching rate of Si is so high that the substrate Si is liable to be etched and thus there is a risk of considerable damages. To prevent such a risk, a $SiO_2$ film must be provided between the $Si_3N_4$ film and the substrate Si, and furthermore the $SiO_2$ film must be thicker owing to a low selectivity between $SiO_2$ and $Si_3N_4$. That is, it has been so far difficult to selectively dry-etch a $Si_3N_4$ film with a higher selectivity or at a higher etching rate than Si and $SiO_2$, and this has been a serious trouble in forming semiconductor devices.

SUMMARY OF THE INVENTION

An object of the present invention is to solve the said problems in the prior art and provide a dry etching gas capable of selectively etching $Si_3N_4$ with a higher selectivity or at a higher etching rate than Si or $SiO_2$ and a process for selectively etching $Si_3N_4$ with the dry etching gas.

To attain this object, a gas consisting of C, H and F atom species at a ratio of F to H by atom (F/H) of not more than 2, such as $CH_3F$, $CH_2F$ or $C_2H_3F_3$ is used in the present invention as a reacting gas for etching $Si_3N_4$ with a higher selectivity.

BRIEF DESCRIPTION OF THE DRAWINGS

FIGS. 2 to 6 are diagrams each showing the effects of the present invention.

DETAILED DESCRIPTION OF THE PREFERRED EMBODIMENTS

EXAMPLE 1

Figure 1:
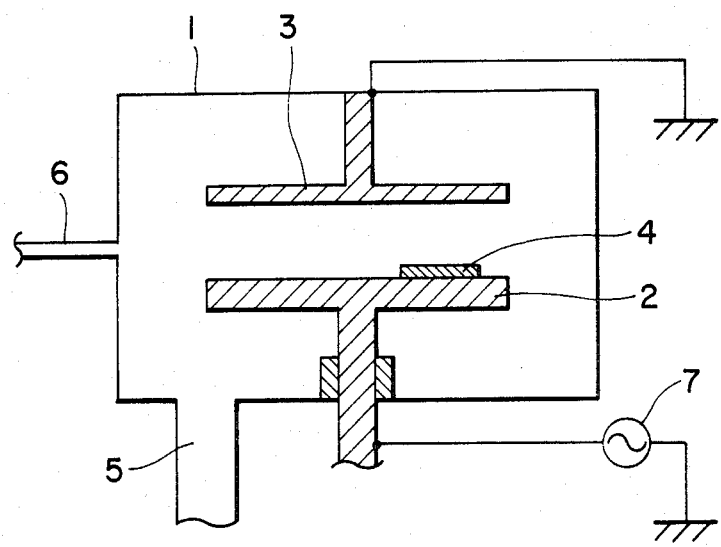
FIG. 1 is a schematic view showing a structure of a dry-etching apparatus in a parallel plate type for use in Examples of the present invention.

In FIG. 1, a dry-etching apparatus used in the following Examples is shown schematically. The dry-etching apparatus of this type is an apparatus in the so-called parallel plate type.

An article 4 to be etched was placed on one of a pair of electrode plates 2 and 3 provided in parallel to each other in a vacuum chamber 1, where the electrodes were disks having a diameter of 40 cm, that is, in this example, on the electrode plate 2, and the vacuum chamber 1 was evacuated to about $10^{-5}$ Torr through a gas outlet 5. Then, $CH_2F_2$ was introduced into the vacuum chamber 1 through a gas inlet 6, and the pressure in the chamber 1 was maintained at about 0.03 Torr.

Then, a high frequency power was applied to the electrode plate 2 from a high frequency power source 7 to generate a plasma between the electrode plates 2 and 3. The introduced $CH_2F_2$ was decomposed and excited thereby to conduct etching of the article 4.

The frequency of the high frequency power was kept constant at 13.56 MHz and the high frequency power was changed between 200 and 500 W. The resulting etching rates of $Si_3N_4$, $SiO_2$ and Si are shown in FIG. 2.

Figure 2:
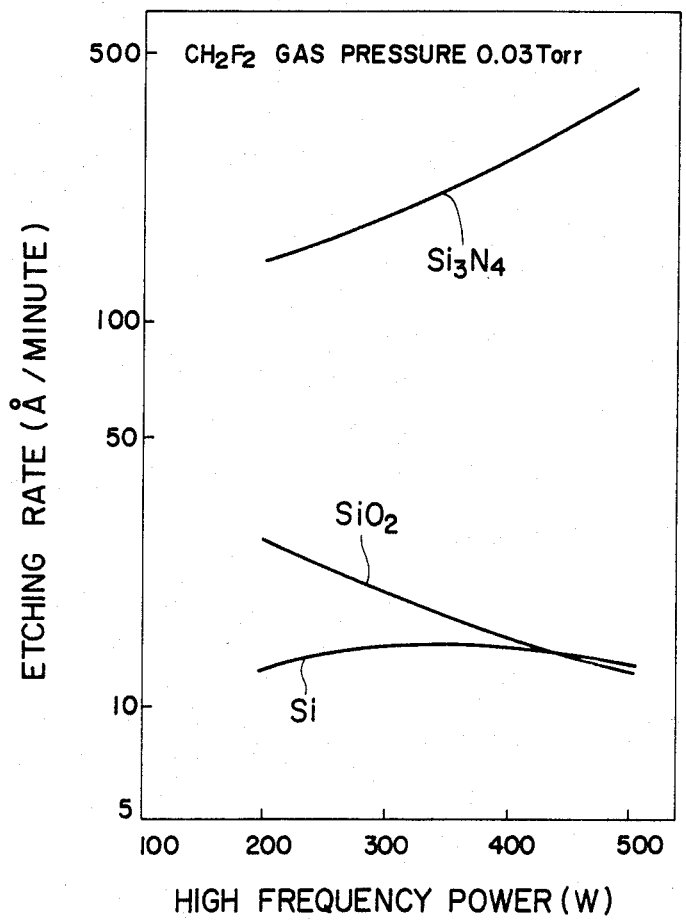

As is apparent from FIG. 2, the etching rate of $Si_3N_4$ was considerably higher than those of $SiO_2$ and Si when the dry etching was carried out with $CH_2F_2$ as a reacting gas. Particularly with increasing high frequency power, a difference in the etching rate became considerably large between $Si_3N_4$ and $SiO_2$ or Si, and it was found that $Si_3N_4$ could be selectively etched with a higher selectivity.

EXAMPLE 2

Etching of $Si_3N_4$, $SiO_2$ and Si was conducted in the same dry-etching apparatus as used in Example 1, while keeping the frequency and power of high frequency power constantly at 13.56 MHz and 400 W, respectively, and changing the pressure of $CH_2F_2$ gas between 0.02 and 0.05 Torr. The results are shown in FIG. 3.

Figure 3:
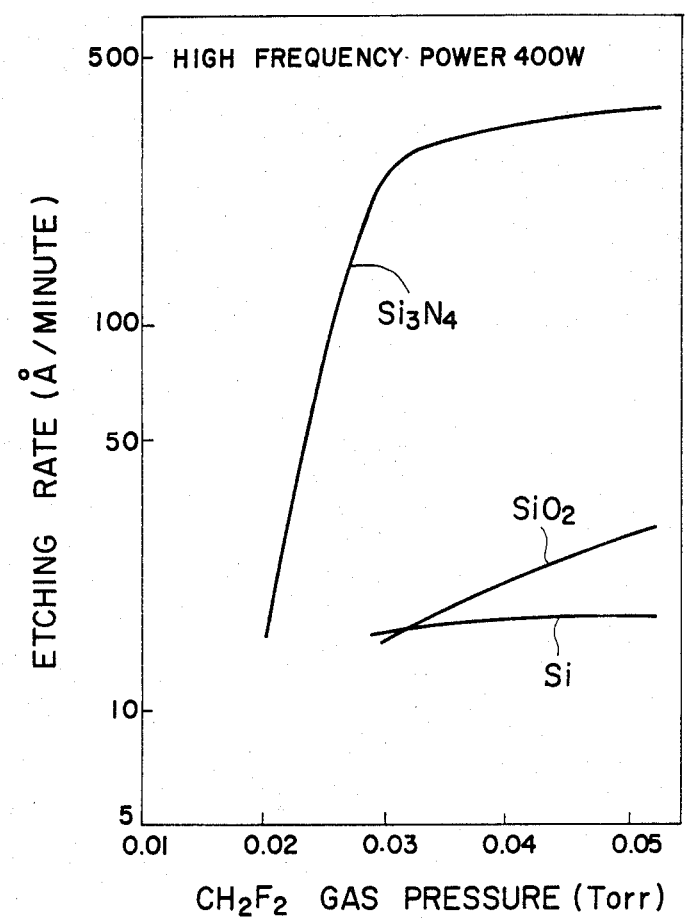

As is apparent from FIG. 3, when the pressure of $CH_2F_2$ exceeded about 0.02 Torr, the etching rate became rapidly higher, and the etching rate of $Si_3N_4$ reached about 3.00–4.00 Å/minute above about 0.03 Torr. That is, it was found that $Si_3N_4$ could be selectively etched in a high etching rate ratio of $Si_3N_4$ to $SiO_2$ and Si of at least about 10.

EXAMPLE 3

Etching rates of $Si_3N_4$, $SiO_2$ and Si were compared in the same dry-etching apparatus as used in Example 1 with $CH_3F$ as a reacting gas. The etching rates were measured by keeping the frequency of the high frequency power and the pressure of $CH_3F$ constant at 13.56 MHz and 0.03 Torr, respectively, while changing the high frequency power between 200 and 500 W. Results are shown in FIG. 4.

Figure 4:
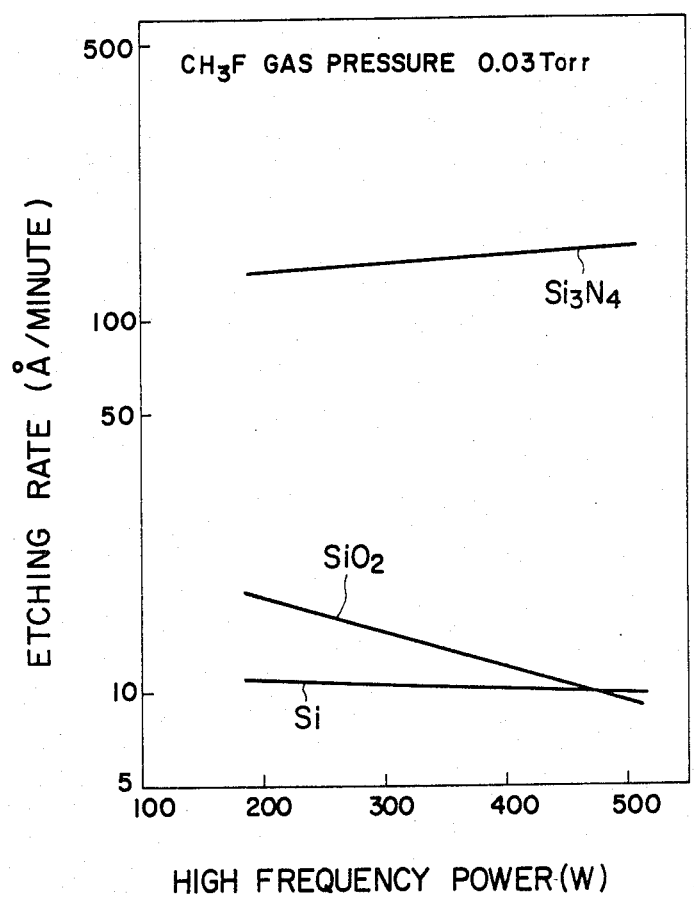

As is apparent from FIG. 4, when $CH_3F$ was used as the reacting gas the etching rate of $Si_3N_4$ was considerably larger than those of $SiO_2$ and Si as in the case of using $CH_2F_2$ as the reacting gas, and particularly with increasing high frequency power, the etching rate ratio of $Si_3N_4$ to $SiO_2$ and Si became very large, and it was found that $Si_3N_4$ could be selectively etched in a high etching rate ratio of at least about 10.

The dependency of the etching rate on pressure was substantially same as in the case of $CH_2F_2$ shown in FIG. 3.

EXAMPLE 4

This example relates to a process for preparing $CH_2F_2$, where $CH_2F_2$ is prepared by gas phase reaction of dichloromethane and hydrogen fluoride in the presence of a catalyst of chromium fluoride, or a catalyst prepared by mixing and molding chromium fluoride and a carrier or a catalyst of chromium fluoride supported on a carrier. One of specific processes is given below:

300 g of commercially available $CrF_3.3H_2O$ was molded into pellets, 6 mm in diameter and 6 mm thick, and then gradually heated in a $N_2$ gas stream for drying and retained at about 400° C. for 2 hours, whereby a $CrF_3$ catalyst was prepared.

100 ml of the catalyst was filled in a reactor made of Hastelloy C, 20 mm in inner diameter and 1 m long. $CH_2Cl_2$ and HF were evaporated in evaporators at 5.4 g/hr and 7.4 g/hr, respectively, and the resulting gases were introduced into the reactor, while keeping the temperature in the reactor at 380° C. under the atmospheric pressure. After the system was thoroughly stabilized, unreacted HF and formed HCl in the gas from the reactor were trapped by an alkali to remove the acids, and remaining organic matters were recovered as a liquid condensate for 5 hours.

Composition of the recovered organic matters was analyzed by gas chromatography, and the following results were obtained.
$CH_2F_2$:11.6 g
$CH_2ClF$:2.8 g
$CH_2Cl_2$:3.8 g It was found from the results that yields on the basis of the $CH_2Cl_2$ fed were as follows:
$CH_2F_2$:70%
$CH_2ClF$:13%

In the foregoing Examples 1 and 2, the etching rates of $Si_3N_4$, $SiO_2$ and Si were obtained by etching them with the thus obtained $CH_2F_2$.

EXAMPLE 5

This example relates to a process for preparing $CH_3F$, where $CH_3F$ is prepared by gas phase reaction of methyl chloride and hydrogen fluoride in the presence of an aluminum fluoride catalyst, or a catalyst prepared by mixing and molding aluminum fluoride and a carrier, or a catalyst of aluminum fluoride supported on a carrier.

One of specific processes is given below.

300 g of $AlCl_3.6H_2O$ was dissolved in water, and 250 g of commercially available aqueous 46% hydrogen fluoride solution was slowly added thereto to form aluminum trifluoride.

Then, the solution was kept at about 70° C. under reduced pressure of about 50 mmHg to remove the by-product hydrogen chloride, excess hydrogen fluoride and most of water by evaporation, and an aluminum trifluoride paste was obtained thereby.

Then, the paste was molded into pellets, 6 mm in diameter and 6 mm thick, and then the pellets were heated and dried in a $N_2$ gas stream and kept at about 400° C. for 3 hours, whereby about 100 g of aluminum fluoride catalyst was obtained.

100 ml of the catalyst was filled in a reactor made of Hastelloy C, 2 mm in inner diameter and 1 m long. $CH_3Cl$ and HF were evaporated at 0.845 g/hr and 2.34 g/hr, respectively, in evaporators and the resulting gases were supplied to the reactor, while keeping the temperature in the reactor at 300° C. under the atmospheric pressure. After the system was thoroughly stabilized, unreacted HF and formed HCl in the gas from the reactor were trapped by an alkali to remove the acids, and the remaining organic matters were cooled and passed through a solvent for 3 hours to recover the organic matters through absorption in the solvent.

The formed $CH_3F$ and supplied $CH_3Cl$ recovered in the solvent in the above manner were analyzed by gas chromatography, and the following result was obtained:
$CH_3F$:0.358 g
$CH_3Cl$:1.98 g As other products, only some low boiling compounds which seemed to have been formed by the decomposition were found.

The foregoing results show that $CH_3F$ was formed in the yield of 21% on the basis of the supplied $CH_3Cl$ and the selectivity to $CH_3F$ on the basis of the reacted $CH_3Cl$ was about 96%.

$CH_3F$ used as the reacting gas in Example 3 was prepared in the manner shown in this Example.

EXAMPLE 6

Relationship between the etching rate and the gas pressure was determined when $Si_3N_4$, $SiO_2$ and Si were etched using $C_2H_3F_3$ as reacting gas, the results are shown in FIG. 5, where the flow rate of $C_2H_3F_3$ was 10 cc/minute and the applied high frequency power was 400 W.

As is apparent from FIG. 5, when $C_2H_3F_3$ was used as a reacting gas, $Si_3N_4$ could be etched with a higher selectivity or at a higher etching rate than $SiO_2$ and Si in the same manner as in the foregoing Examples.

EXAMPLE 7

Etching was carried out with $C_2H_5F$, $C_2H_4F_2$, $C_2H_3F_3$, $C_2H_2F_4$, $C_3H_7F$, $C_3H_6F_2$, $C_2H_5F_3$, $C_3H_4F_4$ and $C_3H_3F_5$ as reacting gas in the same manner as in the foregoing Examples, and it was found that $Si_3N_4$ could be etched with a higher selectivity, and that $Si_3N_4$ could be selectively etched with many gases each consisting of C, H and F atom species and having a ratio of F to H by atom of not more than 2.

On the other hand, no good results were obtained with the gases having a ratio of F to H of more than 2 such as $CHF_3$ or $C_2HF_5$.

With increasing C number, undersirable phenomena such as an increase in deposits, etc are liable to appear.

Thus, it is most preferable to use a gas having a ratio of F to H of not more than 2, and a carbon number of not more than 3. These gases can be used alone, and $Si_3N_4$ can be selectively etched even with a mixture of at least two kinds of these gases.

EXAMPLE 8

In this Example, a mixture of two kinds of gases, which satisfied the conditions as mentioned above, i.e. a gas consisting of C, H and F atom species, and having a ratio of F to H by atom of not more than 2, was used. That is, etching rates were measured by changing a mixing ratio of $CF_2$ to $H_2$ to various degrees, and results are shown in FIG. 6.

As is apparent from FIG. 6, $Si_3F_4$ could be etched with a mixture of gases with a higher selectivity, so long as the mixture of gases can satisfy the conditions as mentioned above, that is, so long as the mixture of gases consists of C, H and F atom species and has a ratio of F to H by atom of not more than 2. It is needless to say that mixtures of other gases than $CF_4$, for example, $CHF_3$, etc. can be used, so long as the mixtures of gases can satisfy the condition as mentioned above.

However, it is often desirable from practical viewpoints of gas stability, uniform composition, etc. to use a gas having a composition satisfying the condition as mentioned above rather than to use a mixture of a plurality of gases to satisfy the conditions as mentioned above.

Gases each having a composition satisfying the condition as mentioned above can be used alone, but also can be used in a combination in an appropriate ratio, or a plurality of gases can be mixed to satisfy the condition as mentioned above, though practically not so preferable, as pointed out above.

At the etching, the gas pressure in the reactor is usually about $10^{-2}$ Torr, but can be appropriately selected, depending upon the mode of etching.

It is also possible to add at least one of other gases such as $N_2$, $O_2$, $H_2$ or He to the etching gas.

As described above, $Si_3N_4$ can be etched at a higher etching rate than $SiO_2$ and Si according to the present invention, and thus where there are $SiO_2$ or Si besides $Si_3N_4$ at the same time, $Si_3N_4$ can be selectively etched. For example, where a $Si_3N_4$ film is formed on a substrate of $SiO_2$ or Si, or on a polycrystalline silicon film, only the $Si_3N_4$ film can be etched without giving any substantial damage to the substrate or the polycrystalline silicon film. It is also possible to selectively etch the $Si_3N_4$ film by masking the $SiO_2$ film or polycrystalline silicon film, and, where there are $Si_3N_4$, $SiO_2$ and Si on a wafer at the same time, only $Si_3N_4$ can be etched while leaving $SiO_2$ or Si as it is.

In dry-etching $Si_3N_4$ according to the conventional dry etching process, it is impossible to dry-etch $Si_3N_4$ with a thoroughly higher selectivity or at a higher etching rate than $SiO_2$ or Si, and consequently the process for fabricating semiconductor devices are restricted to various degrees, and also the structure of semiconductor devices is limited.

According to the present invention, $Si_3N_4$ can be selectively etched with a higher selectivity than $SiO_2$ and Si, as described above, and thus the said restriction or limitation to the process for fabricating semiconductor devices or to the structure of semiconductor devices is considerably less, and selection or design freedom of the process or device structure is considerably increased. For example, it is possible to selectively remove only the exposed parts of $Si_3N_4$ film by etching according to the present invention without removing the exposed parts of $SiO_2$ or Si, and also to etch a $Si_3N_4$ film formed on a $SiO_2$ film, a Si substrate or a Si film without giving any serious damage to the $SiO_2$ film, Si substrate or Si film as an underlayer. Furthermore, it is possible to etch a silicon nitride film by masking a silicon dioxide film or a polycrystalline silicon film.

Such a selective etching of $Si_3N_4$ is quite impossible to carry out according to the conventional dry-etching process using $CF_4$, $SF_6$ or $CHF_3$ as a reacting gas, and is useful particularly for forming semiconductor integrated circuits with a high integration density.

In the foregoing Examples, the so-called reactive sputter-etching apparatus in a parallel plate type shown in FIG. 1 was used as a dry-etching apparatus, and the present invention has the most distinguished feature in selective etching of $Si_3N_4$ with a reacting gas consisting of C, H and F atom species and having a ratio of F to H by atom of not more than 2. Thus, the dry-etching apparatus for use in the present invention is not restricted to the said apparatus in a parallel plate type, and $Si_3N_4$ can be selectively etched in various kinds of well known dry-etching apparatus such as the so-called microwave plasma etching apparatus that generates plasma by microwave excitation, or a planar magnetron-type plasma etching apparatus. Better results can be obtained in a dry-etching apparatus in a parallel plate type when a reacting gas pressure is in a range of 0.01–0.1 Torr. In a dry-etching apparatus of other type, an appropriate reacting gas pressure is selected.

What is claimed is:

1. A gas for selectively etching silicon nitride, which comprises a composition consisting of C, H and F atom species and having a ratio of F to H by atom of not more than 2.

2. A gas according to claim 1, wherein the gas has a carbon number of not more than 3.

3. A gas according to claim 1 or 2, wherein the gas is at least one member selected from the group consisting of $CH_2F_2$, $CH_3F$, $C_2H_5F$, $C_2H_4F_2$, $C_2H_3F_3$, $C_2H_2F_4$, $C_3H_7F$, $C_3H_6F_2$, $C_3H_5F_3$, $C_3H_4F_4$ and $C_3H_3F_5$.

4. A process for etching an article by contact of the article with a plasma of a reacting gas, which comprises selectively etching silicon nitride as the article with a gas consisting of C, H and F atom species and having a ratio of F to H by atom of not more than 2 as the reacting gas.

5. A process according to claim 4, wherein the reacting gas has a carbon number of not more than 3.

6. A process according to claim 4 or 5, wherein the reacting gas is at least one member selected from the group consisting of $CH_2F_2$, $CH_3F$, $C_2H_5F$, $C_2H_4F_2$, $C_2H_3F_3$, $C_2H_2F_4$, $C_3H_7F$, $C_3H_6F_2$, $C_3H_5F_3$, $C_3H_4F_4$ and $C_3H_3F_5$.

7. A process according to claim 4, wherein the etching is carried out in a reactive sputter etching apparatus in a parallel plate type.

8. A process according to claim 7, wherein the reacting gas has a pressure of 0.01–0.1 Torr.

9. A process according to claim 4, wherein at least one of silicon dioxide film and polycrystalline silicon film, and a film of the silicon nitride are exposed to surface.

10. A process according to claim 9, where the film of the silicon nitride is etched by masking the silicon dioxide film or the polycrystalline silicon film or both.

11. A process according to claim 4, wherein the film of the silicon nitride is formed on a silicon substrate, the polycrystalline silicon film or the silicon dioxide film.

12. A process according to claim 4, wherein the reacting gas is mixed with at least one member selected from the group consisting of $N_2$, $O_2$, $H_2$ and He.

13. A process according to claim 4, wherein the reacting gas is a mixture of at least one of $CF_4$ and $CHF_3$, and $H_2$.

* * * * *